(12) United States Patent
Cecil

(10) Patent No.: US 11,822,232 B2
(45) Date of Patent: Nov. 21, 2023

(54) DOSE INFORMATION GENERATION AND COMMUNICATION FOR LITHOGRAPHY MANUFACTURING SYSTEMS

(71) Applicant: Synopsys, Inc., Mountain View, CA (US)

(72) Inventor: Thomas Cecil, Menlo Park, CA (US)

(73) Assignee: Synopsys, Inc., Sunnyvale, CA (US)

( * ) Notice: Subject to any disclaimer, the term of this patent is extended or adjusted under 35 U.S.C. 154(b) by 153 days.

(21) Appl. No.: 17/384,463

(22) Filed: Jul. 23, 2021

(65) Prior Publication Data

US 2022/0035241 A1 Feb. 3, 2022

Related U.S. Application Data

(60) Provisional application No. 63/057,823, filed on Jul. 28, 2020, provisional application No. 63/057,819, filed on Jul. 28, 2020.

(51) Int. Cl.
*G03F 1/70* (2012.01)
*G03F 1/36* (2012.01)

(52) U.S. Cl.
CPC . *G03F 1/70* (2013.01); *G03F 1/36* (2013.01)

(58) Field of Classification Search
CPC ..... G03F 1/70; G03F 1/36; G03F 1/76; G03F 7/70491
See application file for complete search history.

(56) References Cited

U.S. PATENT DOCUMENTS

| | | | | |
|---|---|---|---|---|
| 2012/0286170 A1* | 11/2012 | Van De Peut | ...... | H01J 37/3002 250/397 |
| 2014/0158916 A1* | 6/2014 | Fujimura | ................... | G03F 1/70 716/55 |
| 2015/0062571 A1* | 3/2015 | Kulkarni | ................. | H01L 22/20 356/237.5 |
| 2015/0362834 A1* | 12/2015 | Choi | ........................ | G03F 1/78 250/492.22 |
| 2020/0096876 A1* | 3/2020 | Lin | ..................... | H01J 37/3026 |
| 2023/0034170 A1* | 2/2023 | Fujimura | ............ | H01J 37/3174 |
| 2023/0035090 A1* | 2/2023 | Fujimura | ................... | G03F 1/74 |
| 2023/0061967 A1* | 3/2023 | Van Zwet | ........... | G03F 7/70558 |
| 2023/0088992 A1* | 3/2023 | Pakola | ................... | A61K 45/06 514/44 R |
| 2023/0124768 A1* | 4/2023 | Fujimura | ................... | G03F 1/36 716/53 |

\* cited by examiner

*Primary Examiner* — Nha T Nguyen
(74) *Attorney, Agent, or Firm* — Patterson + Sheridan, LLP

(57) ABSTRACT

A method comprises receiving an integrated circuit (IC) design file and determining, by one or more processors, dose information from the IC design file. The method further comprises determining, by the one or more processors, a mask vector file from the IC design file, and converting, by the one or more processors, the dose information to a vector file format. Further, the method comprises outputting the dose information in the vector file format and the mask vector file to a mask writer device.

20 Claims, 11 Drawing Sheets

DOSE INFORMATION GENERATION AND COMMUNICATION FOR LITHOGRAPHY MANUFACTURING SYSTEMS

RELATED APPLICATION

This application claims the benefit of U.S. provisional patent application Ser. No. 63/057,819, filed Jul. 28, 2020, and U.S. provisional patent application Ser. No. 63/057,823, filed Jul. 28, 2020, which are hereby incorporated herein by reference.

TECHNICAL FIELD

The present disclosure relates to generating dose information for a lithography manufacturing process, and, more specifically, generating dose information based on wafer simulation.

BACKGROUND

Lithography manufacturing systems fabricate integrated circuit (IC) chips from associated IC chip designs. The lithography manufacturing systems use masks (photomasks) during the fabrication process to control where light is applied to a photoresist material layer on a wafer (e.g., substrate). A masks is disposed over a wafer and a light is applied to the wafer through the mask. As light passes through apertures within the mask, the light interacts with the photoresist material. The wafer is then developed and processed via an etching or deposition process for IC chip fabrication.

A mask writing process is used to form the masks from mask blanks. For example, a mask writer device apply one or more energy beams to a mask blank to develop the mask. In many instances, the mask writing device determines dose information to control the exposure energy used during IC chip fabrication.

SUMMARY

In one example, a method comprises receiving an integrated circuit (IC) design file and determining, by one or more processors, dose information from the IC design file. The method further comprises determining, by the one or more processors, a mask vector file from the IC design file, and converting, by the one or more processors, the dose information to a vector file format. Further, the method comprises outputting the dose information in the vector file format and the mask vector file to a mask writer device.

In one example, a lithographic system comprises a memory and a processor coupled with the memory. The processor configured to receive an IC design file and determine dose information from the IC design file. Further, the processor is configured to determine a mask vector file from the IC design file, and convert the dose information to a vector file format. The processor is further configured to output the dose information in the vector file format and the mask vector file to a mask writer device.

In one example, a non-transitory computer readable medium comprising stored instructions, which when executed by a processor, cause the processor to receive an integrated circuit (IC) design file, and determine dose information from the IC design file. The processor is further caused to determine a mask vector file from the IC design file, and convert the dose information to a vector file format. Further, the processor is caused to output the dose information in the vector file format and the mask vector file to a mask writer device.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
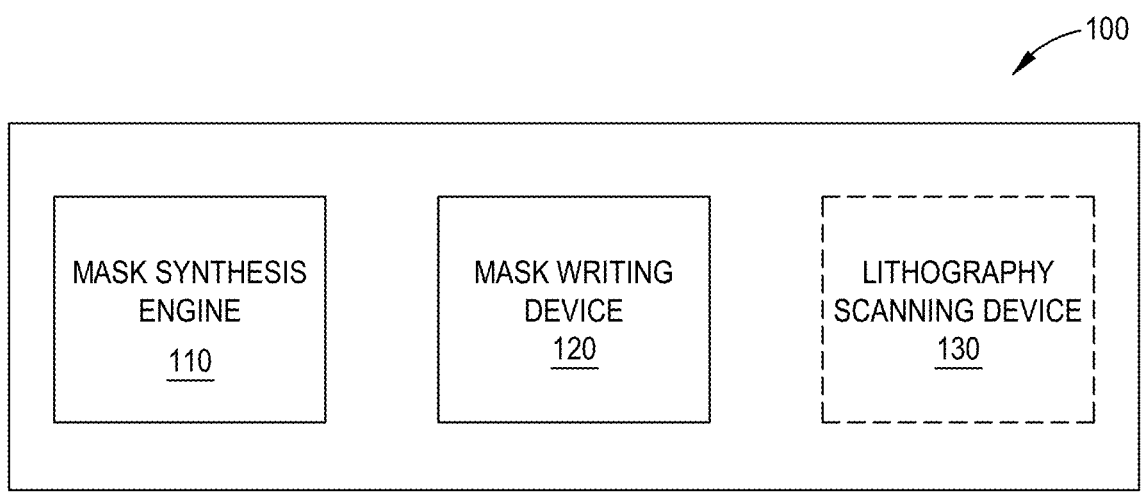
FIG. 1 illustrates a block diagram of a lithography system, in accordance with some embodiments of the present disclosure.

Aspects of the present disclosure relate to dose information generation and communication for lithography manufacturing systems.

Integrated circuit (IC) chips are fabricated by lithography manufacturing systems using lithography manufacturing processes. A lithography manufacturing system exposes a photoresist layer on a wafer (e.g., substrate) to light through a mask (e.g., photomask). The mask is generated (e.g., written or printed) by a mask writing device based on a digital mask design file received from a mask synthesis engine.

The mask synthesis engine implements optical proximity correction (OPC) and inverse lithography technology (ILT) processes, among others, to generate the mask design files. The mask design file may include polygons generated form the IC chip design. The mask synthesis engine generates a mask design file, or mask design files, based on the circuit design of the IC chip. For example, a mask synthesis engine determines the polygons (e.g., geometric shapes) of the mask that define the pattern of apertures (or openings or holes) within the mask based on the circuit design of the IC chip.

During the fabrication process, the mask is disposed over a wafer (or substrate). A ultra-violet light, or other type of light suitable for reacting with the photoresist, is applied to the wafer. The mask blocks light in regions that do not correspond to the apertures, and allows light to pass through regions corresponding to the apertures. As the light passes through the apertures, the light interacts with photosensitive materials on the wafer in corresponding regions, generating a pattern on the wafer. The patterned wafer is then exposed to an etching and/or deposition process to fabricate the IC chip.

During the mask writing process, the mask is generated based on the mask design. The mask writing device includes a multi-beam mask writer (MBMW) device. The mask writing device applies an energy beam to a mask blank based on dose information and a mask design file to generate a printed mask.

In many lithography manufacturing systems, there is a separation between the mask synthesis engine and the mask writing device such that the mask synthesis and mask writing devices are implemented independently from each other, making a tight coupling between the two difficult. In such systems, the mask synthesis engine and mask writing device rely on the handoff of a digital mask design file in a vector file format (e.g., Graphic Design System (GDS) stream format or Open Artwork System Interchange Standard (OASIS) format) between a mask synthesis tool and a mask writing tool. In such a system, the dose information is generated by the mask writing device. Generating the dose information within the mask writing device does not take into account the possible errors introduced when generating a wafer as the mask writing tool does not have access to the IC chip design. Accordingly, errors may be introduced during the IC chip fabrication process based on errors in the dose information. However, by generating the dose information within the mask synthesis engine, while also generating the mask vector format, errors generated in the mask writing process are decreased, increasing the IC chip fabrication yield, as compared to systems that generate the dose information outside of the mask synthesis tool and within the mask writing device.

FIG. 1 illustrates a lithography system 100, according to one or more examples. The lithography system 100 includes a mask synthesis engine 110 and a mask writing device 120. Further, the lithography system 100 may additionally include a lithography scanning device 130. The lithography scanning device 130 is optional, and, in some examples, the lithography scanning device 130 is omitted. The lithography system 100 includes one or more processing devices (e.g., the processing device 1202 of FIG. 12) and one or more memory devices (e.g., the main memory 1204 and/or machine-readable medium 1224 of FIG. 12). The one or more processing devices execute instructions (e.g., instructions 1226 of FIG. 12) stored in the one or more memory devices to receive IC chip designs, process the IC chip designs to determine dose information, and generate a physical mask.

The lithography system 100 receives an IC chip design and generates a digital mask design file and a dose information from the IC chip design. Further, the lithography system 100 generates a physical mask from the mask design file and dose information, and fabricates a printed wafer (substrate) using the physical mask.

The mask synthesis engine 110 receives an IC chip design (e.g., an IC chip design file). The IC chip design is received from a system connected to the lithography system 100 or an input device connected to the lithography system 100. In another example, the mask synthesis engine 110 receives the IC chip design from a memory of the lithography system 100. For example, the mask synthesis engine 110 accesses the memory to acquire the IC chip design. The mask synthesis engine 110 processes the IC chip design to generate dose information and a mask design. The mask synthesis engine 110 further generates a vector file format from the dose information. Methods 200, 300, 500, and 1000 FIGS. 2, 3, 5, and 10, respectively, further describe the process for generating the dose information.

Figure 4:
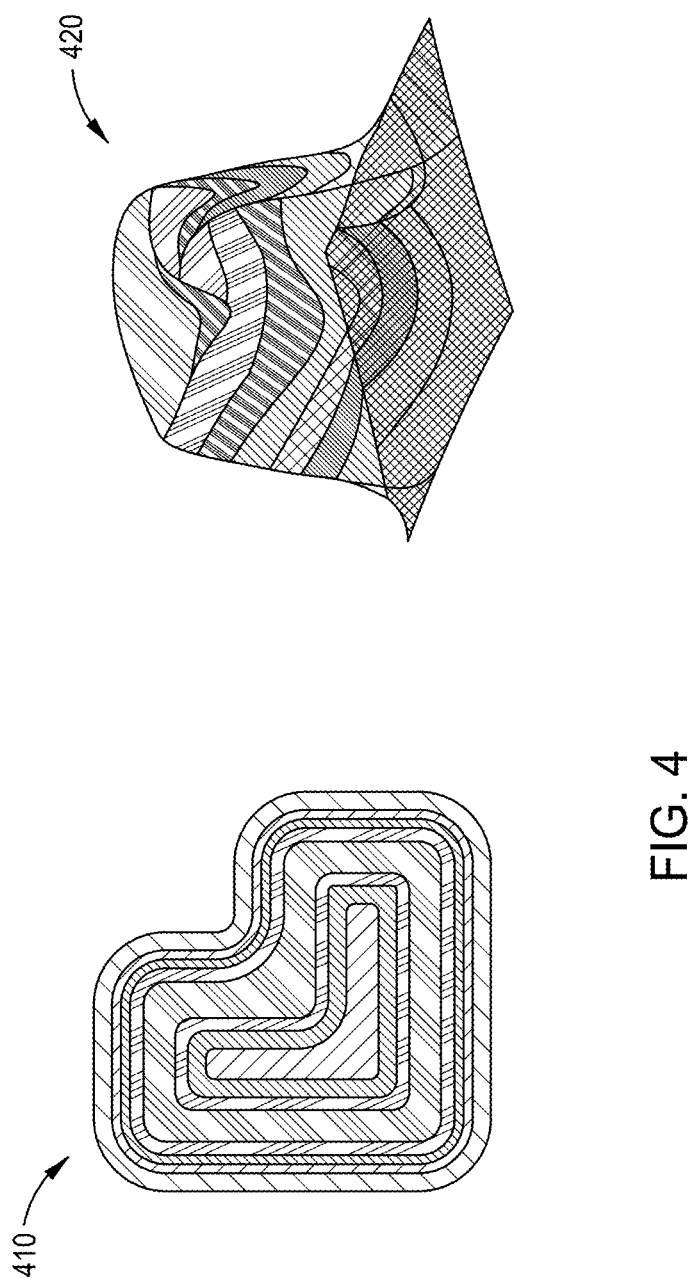
FIG. 4 illustrates portions of dose information, in accordance with some embodiments of the present disclosure.

The dose information may be represented as a dose map. In one example, the dose information is a multi-dimensional dose map. For example, the dose information is a three dimensional dose map. The dose information defines the amount of energy (e.g., exposure energy) applied by the mask writing device to a mask blank. In one example, the dose information define the exposure applied across the surface of a mask blank to generate a printed mask. The variations (gradation levels) of the dose map define the amount of energy applied to different locations along the surface of the mask blank. In one example, the dose information is a dose map that represents the exposure energy in three dimensions. In such an example, the X and Y axis of the dose map correspond to the surface of the mask blank. Locations along the surface of the mask blank include corresponding X and Y coordinates. The Z axis of the dose map corresponds to the exposure energy. The greater the value in the Z axis, the greater the exposure energy in that corresponding location. Each X and Y coordinate of the dose map, and each corresponding location along the surface of the mask blank, is associated with an exposure energy. FIG. 4 illustrates portions of an example dose map.

Figure 7:
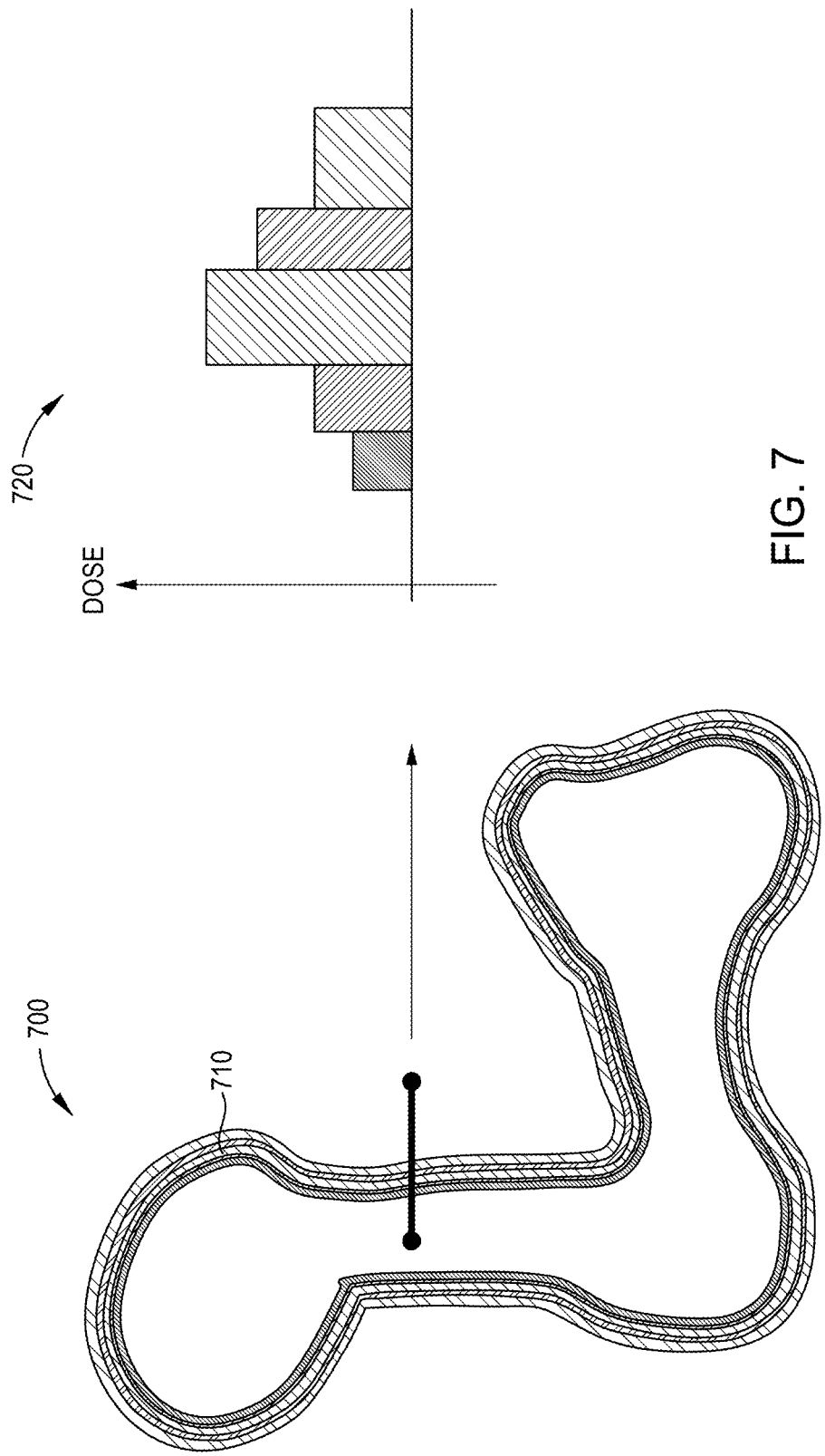
FIG. 7 illustrates a portion of an example dose profile, in accordance with some embodiments of the present disclosure.
Figure 9:
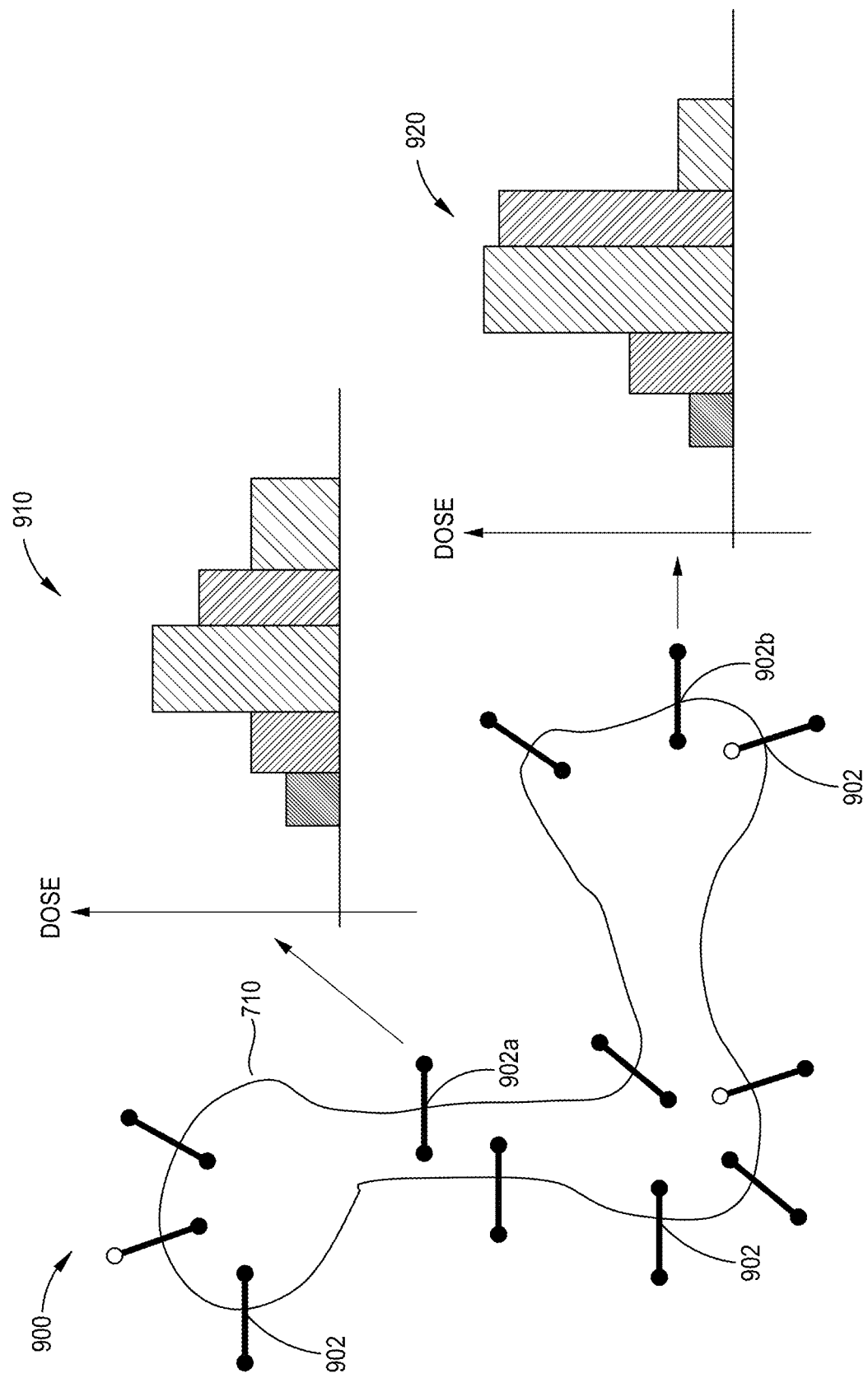
FIG. 9 illustrates a portion of an example dose profile, in accordance with some embodiments of the present disclosure.

In one example, the dose information includes dose profiles. The dose profiles corresponds to the polygons of the IC chip design or the mask design file. For example, the dose profiles are along the edges of the polygons. The dose profiles indict the dose amount (e.g., levels or values) which may vary along the edges of the corresponding polygons. FIG. 7, and FIG. 9 illustrate example dose profiles 710 and 900, respectively.

The mask synthesis engine 110 performs wafer monitoring while the dose information is generated. Accordingly, the wafer error is smaller than in systems that perform dose generation outside of the mask synthesis engine 110, for example, within the mask writing device 120. Performing dose information generation within the mask synthesis engine 110 allows greater control during the generation of the dose information and the ability to monitor the changes to a fabricated IC chip (e.g., final wafer). In such system effects of the error within the fabricated IC chip (e.g., a final wafer) are known and accounted for during generation of the dose information. In one example, total wafer error is determined from:

$$E_{total} = E_{synthesis} + E_{writer} * \text{MEEF}. \quad \text{Equation 1}$$

In equation 1, $E_{total}$ is the total wafer error, $E_{synthesis}$ is the error associated with the mask synthesis engine, and $E_{writer}$ is the error associated with the masker writer device. MEEF is the mask error enhancement factor indicating how an error in the mask is amplified within the wafer. The factor MEEF is known by the mask synthesis engine 110 and may be taken into account when generating the dose information. Accordingly, the mask synthesis engine 110 is able to generate the dose information while inducing less errors than the mask writing device 120.

The mask synthesis engine 110 communicates the dose information and the mask design to the mask writing device 120. The mask synthesis engine 110 converts the dose information to a vector file format which is communicated to the mask writing device 120. The mask synthesis engine 110 may additionally, or alternatively, communicate the mask design file and/or dose information to a memory of the lithography system 100.

Figure 11:
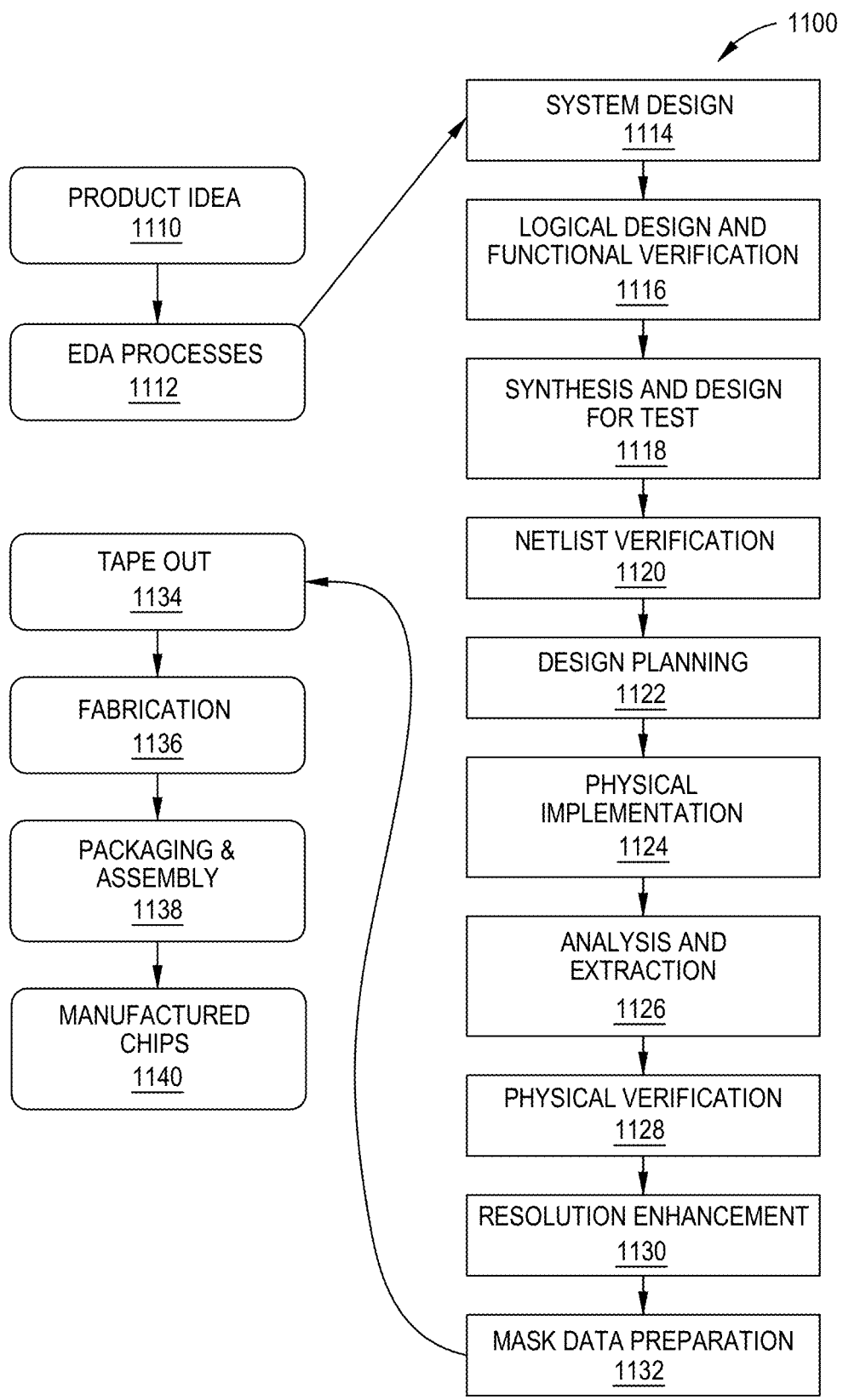
FIG. 11 depicts a flowchart of various processes used during the design and manufacture of an integrated circuit in accordance with some embodiments of the present disclosure.

In one or more examples, the mask synthesis engine 110 communicates the dose information and the mask design to the mask writing device 120 via a network (e.g., the network 1220 of FIG. 11). In one example, the mask synthesis engine 110 includes one or more processors (e.g., the processing device 1202) of a computer system (e.g., the computer system 1200) and is coupled to the mask writing device 120 via a network (e.g., the network 1220). In such an example, the computer system of the mask synthesis engine 110 is physically separate from the mask writing device 120 and is connected to the mask writing device 120 via a network. Further, the computer system of the mask synthesis engine 110 and the mask writing device 120 are at different physical locations from each other.

Figure 12:
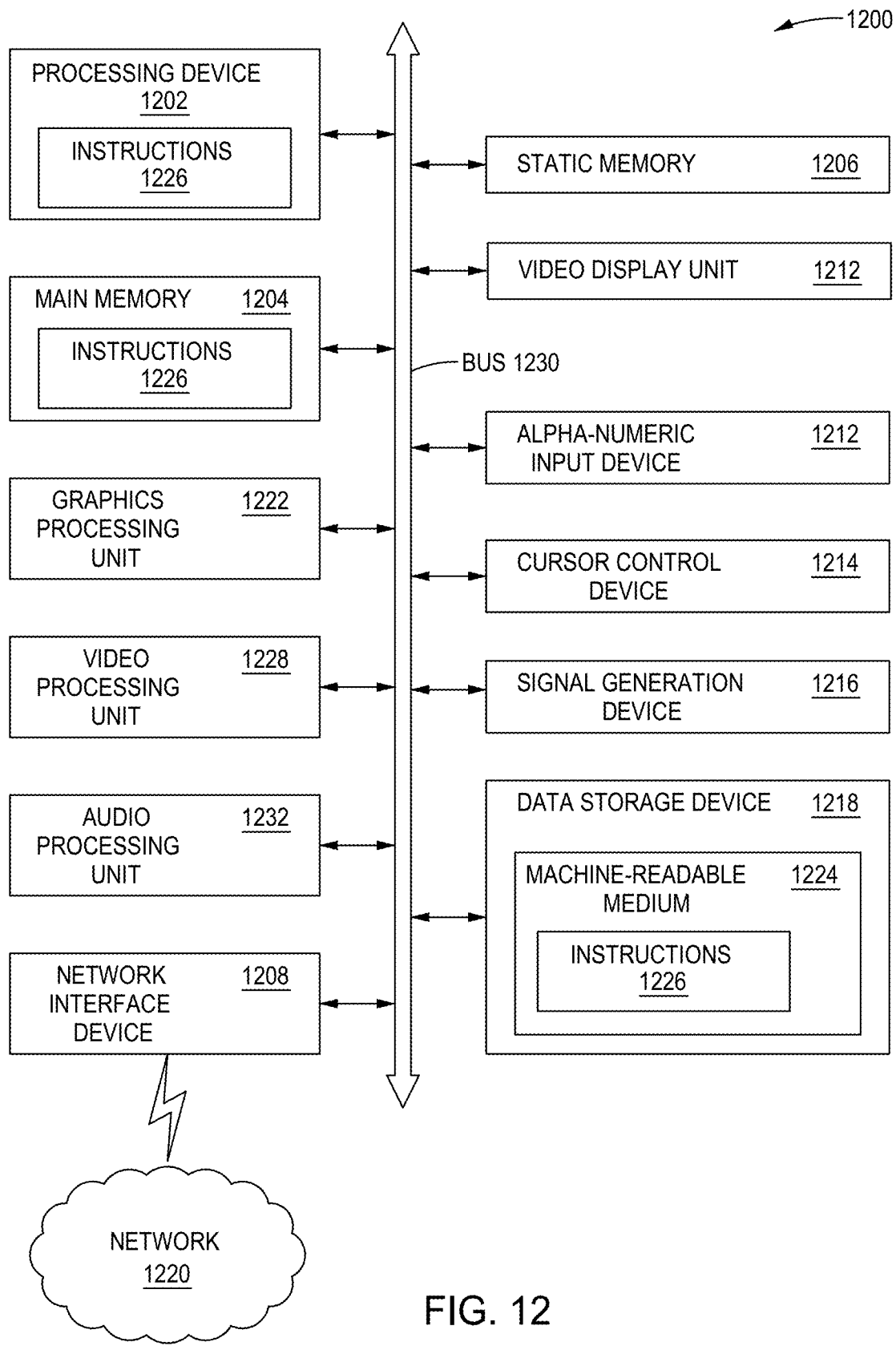
FIG. 12 depicts an abstract diagram of an example computer system in which embodiments of the present disclosure may operate.

The mask synthesis engine 110 includes one or more processing devices (e.g., the processing device 1202 of FIG. 12) that execute instructions (e.g., the instructions 1226 of FIG. 12) stored in a memory device (e.g., the main memory 12004 and/or machine-readable medium 1224 of FIG. 12) to receive the IC chip design file and generate the mask design file and the dose information.

The mask writing device 120 receives the dose information and the mask design file. In one example, the mask writing device 120 receives the mask design file and the dose information from the mask synthesis engine 110. The mask writing device 120 may receive the dose information in a vector file format. In other example, the mask writing device 120 accesses a memory device of the lithography system 100 to acquire the mask design file and the dose information.

The printed mask may be generated from a mask blank (or substrate). The mask blank may be a silica blank, among others. Apertures (e.g., holes or openings) are formed in the mask blank during the printing process based on the polygons of the mask design file and the dose information. A mask blank is coated with a photoresist material. The photoresist material is exposed to an energy beam that interacts with the photoresist material. The amount and location of energy applied by the energy beam based on the dose information.

The energy beam applied to the photoresist may be an electron beam or a photon energy beam. An electron beam is applied by an electron beam writer that directs a focused beam of electrons onto the blank. A photon energy beam is applied by a laser writer. The photoresist is then developed to create openings through the photoresist exposing portions of the underlying mask blank.

A mask blank is etched through the openings in the photoresist to remove portions of the mask blank based on the mask design file. The etching process may include a liquid (e.g., wet) etching process or a plasma (e.g., dry) etching process. The etching processing removes portions of the blank where the photoresist coating has been removed, forming apertures (e.g., holes or openings) within the mask blank. Alternatively, or additionally, a deposition process may be used to deposit material onto the mask blank where the photoresist layer has been removed.

The mask writing device 120 includes one or more processing devices (e.g., the processing device 1202 of FIG. 12) that execute instructions (e.g., the instructions 1226 of FIG. 12) stored in a memory device (e.g., the main memory 1204 and/or machine-readable medium 1224 of FIG. 12) to receive the mask design file and dose information and generate a printed mask.

The lithography scanning device 130 receives the printed mask from the mask writing device 120 for IC chip fabrication. The lithography scanning device 130 positions the printed mask over a substrate and applies a light to the substrate through the printed mask. Light that passes through the apertures of the printed masks and interacts with the photoresist material on the substrate. The light may be an ultraviolet (UV) light or another wavelength of light. The photoresist material is removed from the substrate during a subsequent development process. The developed substrate is exposed to an etching and/or deposition process IC chip fabrication. In one example, multiple different patterned masks are applied to a substrate at different times during the IC chip fabrication process.

Figure 2:
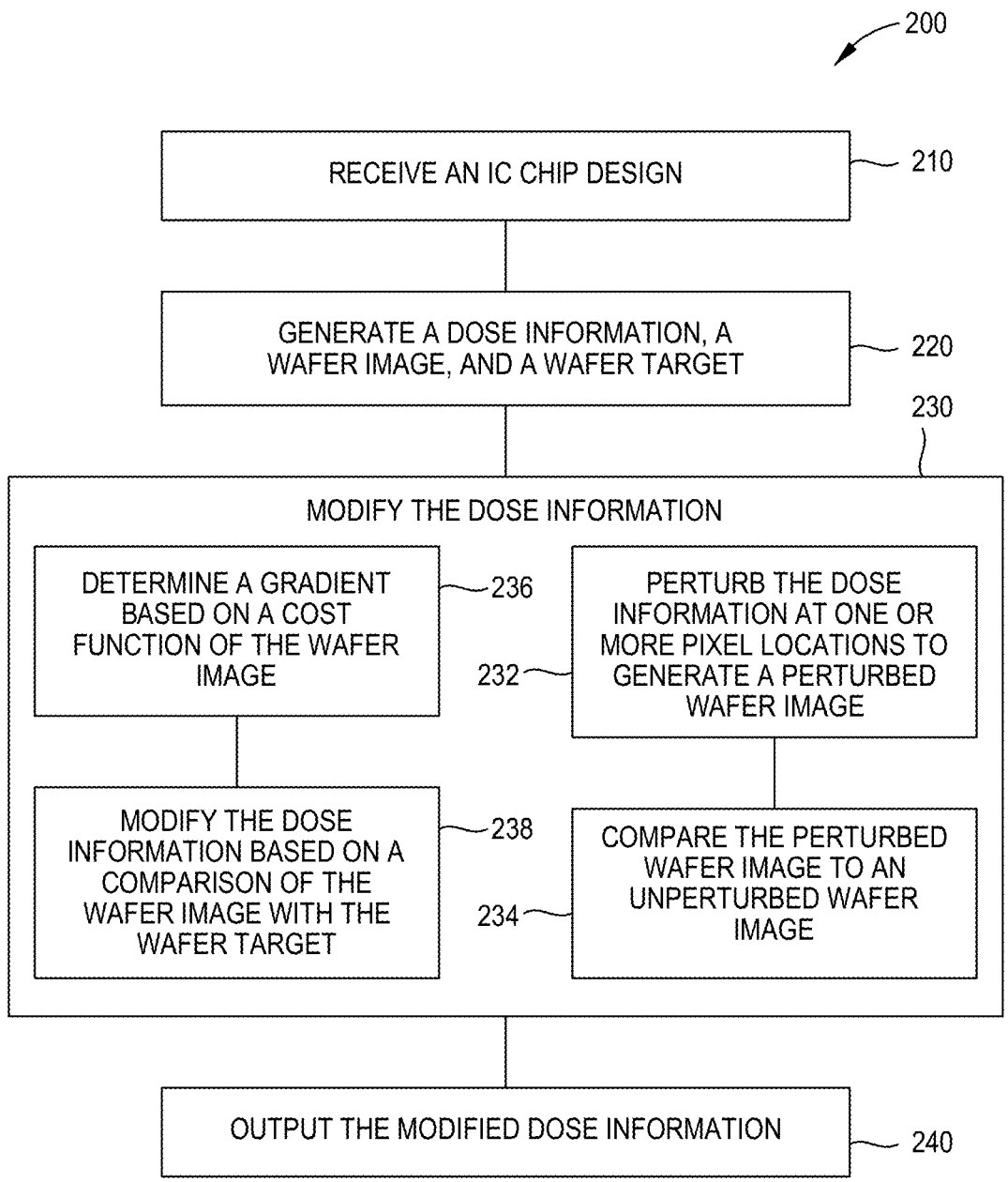
FIG. 2 illustrates a flowchart of a method for modifying dose information, in accordance with some embodiments of the present disclosure.

FIG. 2 is a flowchart of a method 200 for generating dose information, according to one or more examples. The method 200 is performed by the mask synthesis engine 110. Further, the method 200 is executed as part of mask data preparation 1132 of FIG. 11. At block 210, an IC chip design is received. For example, the mask synthesis engine 110 receives the IC chip design from another processing system, an input device, or a memory device. The chip design may be in a vector format (e.g., OASIS or GDS file format) or another file format.

At block 220, dose information and wafer target are generated. The mask synthesis engine 110 generates the dose information, a wafer image, and a wafer target from the IC chip design. A wafer image is a function of the light intensity on a corresponding physical wafer. The wafer image may be a pixelwise sampling (or other type of user defined sampling) of the light intensity or function of the light intensity. In one example, the wafer image is a step function like function of the light intensity that is based on the corresponding development (etching) behavior of a physical wafer. In such an example, the wafer image is in a binary image. In another example, the wafer image is a contour of a function of the light intensity that is converted into polygons.

The wafer target is an ideal representation of the wafer image. The wafer target is defined at one or more of the locations where the wafer image is defined. The wafer target may be generated using pixel sampling (or other sampling techniques) or contouring, among others. In one example, the wafer target is derived by taking a function of the polygons of the IC chip design. For example, the polygons are rasterized to generate a pixel representation, rounding to generate printed polygons, or by applying other functions to convert the polygons to pixel representations. In other examples, other polygon processing techniques may be applied to the polygons to generate the wafer target.

In one example, generating the dose information comprises converting the IC chip design into a resterized image file (e.g., bitmap or other raster image file) representation. The representation of the dose map can be constructed by a rasterization method or other geometry based method which converts polygons within the IC chip design to image fields. For example, the polygons may be converted to bitmap fields. In another example, the polygons are converted based on a levelset representation of the polygons. In another example, a rule based assignment is applied to determine local doses for pixels proximate the edges of the polygons of the IC chip design. The rule based assignment may include geometry based metrics. In another example, applying the rule based assignment may include determining a Gaussian distribution of dose centered at edges of the polygons of the IC chip design. Further methods may include using polygon density or curvature methods to generate the dose information.

At block 230, the dose information is modified. The mask synthesis engine 110 modifies the dose information. In one example, the dose information is modified based on a decision that the wafer image and the wafer target do not converge. The mask synthesis engine 110 compares the wafer image with the wafer target to determine whether or not the wafer image converges with the wafer target. Comparing the wafer image with the wafer target includes generating a pixelated representation of the wafer image, and comparing the pixelated representation of the wafer image with the wafer target. A wafer image and a wafer target are determined to converge based on the difference between the pixelated representation of the wafer image and the wafer target being less than a threshold. In another example, comparing the wafer image with the wafer target includes sampling the wafer image. The samples are compared to corresponding points within the wafer target, comparing the intensity of the samples to corresponding points within the wafer target. A wafer image and a wafer target are determined to converge based on the difference between intensities being less than a threshold. In one example, comparing the wafer image with the wafer target includes comparing width and/or spacing information of the wafer image within corresponding thresholds. A wafer image and a wafer target are determined to converge based on the width and/or spacing of the wafer image satisfying the corresponding thresholds.

The mask synthesis engine 110 generates the modified dose information based on determining that the wafer image and wafer target converge. The dose information may be represented by a dose map that indicates the relative dose amount at different locations over the surface of the mask design. The dose map may include a gradient of the lithography metrics with respect to the dose change at each pixel of the wafer image. In one example, the dose information includes a plurality of pixels and modifying the dose information comprises perturbing the dose information of one or more pixels.

At block 232, the dose information is perturbed at one or more pixel locations to generate a perturbed wafer image. The mask synthesis engine 110 perturbs the dose information and generates a perturbed wafer image from the perturbed dose information. The perturbed wafer image is generated by simulating the IC chip fabrication process based on the perturbed dose information. For example, a mask design is generated from the IC chip design. The mask design and the perturbed dose information are used to generate a perturbed wafer image. The perturbed wafer image is a simulation result determined from the perturbed dose information.

At block 234, the perturbed wafer image is compared to an unperturbed wafer image. The unperturbed wafer image is the wafer image that is generated before the dose information is perturbed at block 310. The mask synthesis engine 110 detects differences between the perturbed and unperturbed wafer images based on the comparison. The differences are used to determine the local impact made by the perturbed pixels in the perturbed dose information. In one example, the perturbed wafer image is determined as an augmentation of the unperturbed dose information image by computing a separate perturbation model or look up table. Utilizing a perturbation model and/or look up table allows for the determination of the result of perturbations for a dose information which can be combined with the unperturbed image. Determining the perturbed wafer image is such a method is faster as compared to computing a wafer image based on a complete simulation of a dose map. In various embodiments, the mask synthesis engine 110 includes a simulation block configured to generate wafer images from a mask design and dose information. The simulation block may be modeled by a linear system of operations.

The differences between the unperturbed and perturbed wafer images are used as an inputs to a dose information modification. The differences between the unperturbed and perturbed wafer images are used to determine the local impact made by the perturbed pixels in the perturbed dose information. Further, the differences between the unperturbed and perturbed wafer images may be used to construct a numerical gradient as an input to dose information modification. The dose information modification process includes a gradient based modification. The dose information modification process modifies the dose information to correct for any mismatches between the unperturbed wafer image and the wafer target. For example, the dose values of the dose information are modified (e.g., increased or decreased) to correct for any mismatches between the unperturbed wafer image and the wafer target.

In another example, at block 230, the dose information is modified based on a cost function. The cost function is based on the difference between the wafer image and the wafer target. In one or more examples, the cost function may additionally, or alternatively, include other constraints in the lithography process, e.g., mask writing rules. At block 236, a gradient is determined based on a cost function of the simulated wafer image. The mask synthesis engine 110 determines the gradient based on a cost function of the wafer image. The cost function may be defined as dCost/dDose. The dCost/dDose function or functions are utilized to modify the dose information. The cost function is used to compare the wafer image with the wafer target.

In one example, a cost function C(M) can be expressed as $C(M)=\iint(V_M(x, y)-T(x,y))^2 dxdy$, and a perturbed cost function can be expressed as $C(M, m, \varepsilon)=\iint(V_M(m, \varepsilon)(x, y)-T(x,y))^2 dxdy$. $V_M(m, \varepsilon)(x, y)$ is the intensity signal that is achieved along a wafer image resulting from using a dose information during lithography that has a set, M, of pixels, $m_i$, modified in amplitude by a perturbation amount $\varepsilon$, and (x, y) is in the image surface. $V_M(x, y)$ is the intensity signal from the unperturbed dose information. T(x, y) is a target intensity signal that forms features at wafer image. A cost function gradient is generated as a vector $$\left(\frac{dC(M)}{dm_1} \cdots \frac{dC(M)}{dm_{N_m}}\right)$$

for $N_m$ number of pixels, $m_i$, of the dose information. The vector entries are generated for a given pixel, m, of the dose information, as $$\frac{dC(M)}{dm} = \lim_{\varepsilon \to 0} \frac{C(M, m, \varepsilon) - C(M)}{\varepsilon}.$$

At block 238, the dose information is modified based on a comparison the wafer image with the wafer target. In one example, the mask synthesis engine 110 compares the wafer image with the wafer target and employs the gradient determined from the cost function to correct for any mismatches between the wafer image and the wafer target. For example, the mask synthesis engine 110 alters (e.g., increases or decreases) the dose values of the dose information to correct for any mismatches between the wafer image and the wafer target. In one example, to modify the dose information, one or more gradient based optimization techniques are applied to the gradient information to modify dose assignments within the dose information to minimize or maximize the cost function. For example, the gradient based optimization technique may be a steepest descent optimization or other gradient based optimizations.

At block 240, the modified dose information is output. The mask synthesis engine 110 outputs the modified dose information to the mask writing device 120. The modified dose information is output based on a determination that the wafer image associated with the dose information is determined to converge with the wafer target. In one example, based on the determination that a wafer image does not converge with the wafer target, the dose information is modified as is described at block 230.

Figure 3:
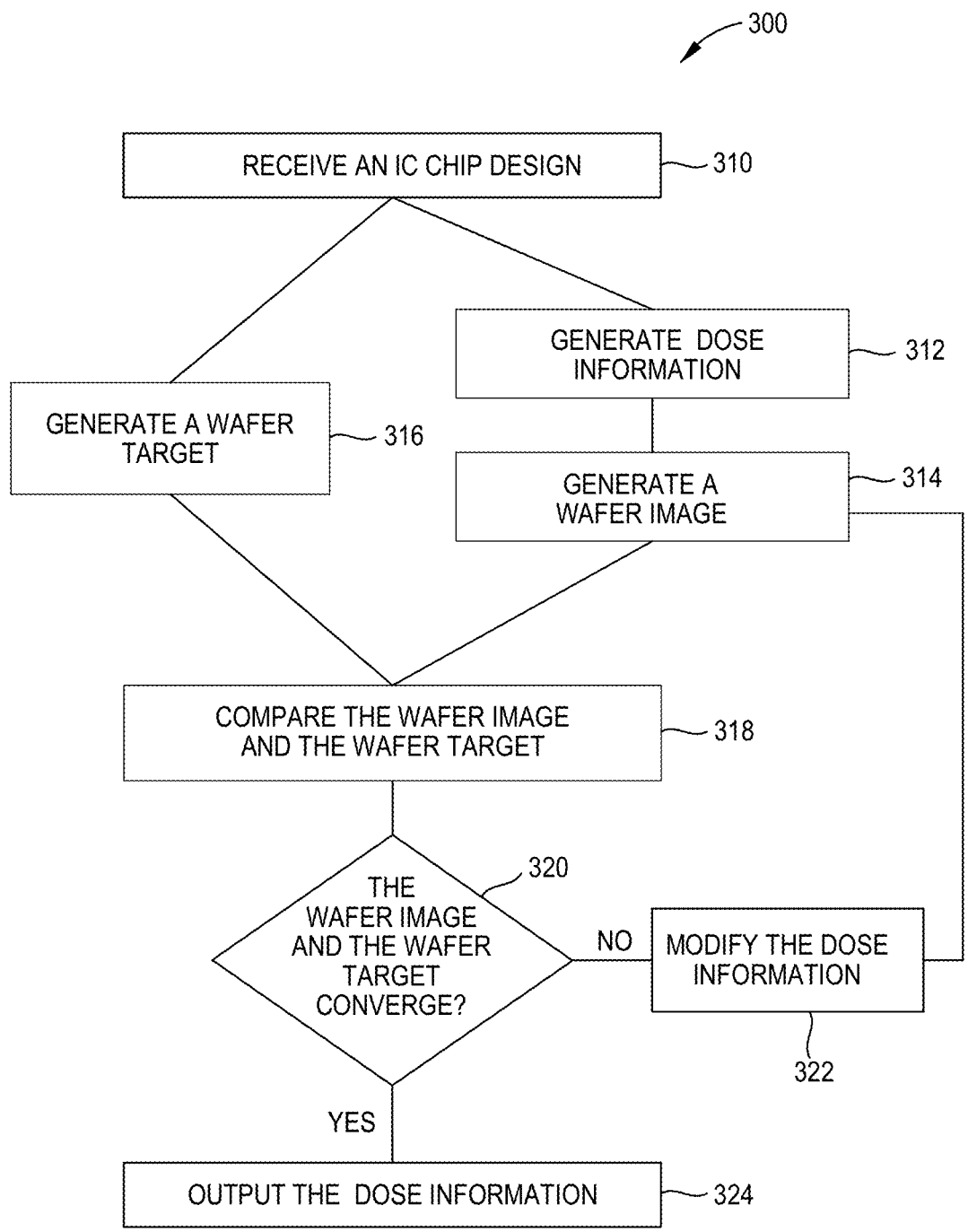
FIG. 3 illustrates a flowchart of a method for modifying dose information, in accordance with some embodiments of the present disclosure.

FIG. 3 is a flowchart of a method 300 for generating dose information, according to one or more examples. The method 300 is performed by the mask synthesis engine 110. Further, the method 300 is executed as part of mask data preparation 1132 of FIG. 11. At block 310, an IC chip design is received. For example, the mask synthesis engine 110 receives the IC chip design from another processing system, an input device, or a memory device. The chip design may be in a vector format (e.g., OASIS or GDS file format) or another file format.

At block 312, dose information is generated. The mask synthesis engine 110 generates the dose information from the IC chip design. Generating the dose information comprises converting the IC chip design into a resterized (e.g., bitmap or other raster image file) representation. The representation of the dose information is constructed by a rasterization method or other geometry based method which converts polygons to bitmap fields. In another example, the polygons of the IC chip design are converted to a levelset representation. In another example, a rule based assignment is applied to determine local doses for pixels proximate the edges of the polygons of the IC chip design. The rule based assignment may include geometry based metrics. In another example, applying the rule based assignment may include determining a Gaussian distribution of dose centered at edges of the polygons of the IC chip design. Further methods to generate the dose information may include using polygon density or curvature methods indicate the dose amplitude modifications.

At block 314, a wafer image is generated. The mask synthesis engine 110 generates the wafer image from a mask design and the dose information. The mask synthesis engine 110 simulates the mask writing process and the IC fabrication process based on the mask design and the mask information to generate the wafer image. The wafer image is a simulated version of a fabricated IC chip.

At block 316, the IC chip design is converted to a wafer target. The wafer target may be a bitmap file or a polygon file, among others. The mask synthesis engine 110 converts the IC chip design into a wafer target. In one example, converting the IC chip design into a wafer target includes identifying design polygons within the IC chip design and processing the design polygons to generate the wafer target. Processing the design polygons includes one or more of rounding the polygons to make a printable representation, rasterizing the polygons, creating a level set interface representation of the polygons, and selecting points or gauges on within the IC chip design where a wafer image will be monitored.

Block 316 is completed during a period that at least partially overlaps with the period or periods during which the blocks 312 and/or 314 are completed. In one example, block 316 is completed during a period that does not overlap with a period or periods during which the blocks 312 and 314 are completed.

At block 318, the wafer image is compared to the wafer target. For example, the mask synthesis engine 110 compares the wafer image and wafer target. Comparing the wafer image with the wafer target includes generating a pixelated representation of the wafer image, and comparing the pixelated representation of the wafer image with the wafer target. In another example, comparing the wafer image with the wafer target includes sampling the wafer image. The samples are compared to corresponding points within the wafer target, comparing the intensity of the samples to that of corresponding points within the wafer target. In one example, comparing the wafer image with the wafer target includes comparing a width and/or spacing of the wafer image with corresponding thresholds determined from the wafer target.

At block 320, a determination as to whether or not a wafer image and the target wafer converge is made. The mask synthesis engine 110 determines whether or not the wafer image and the target wafer converge. In one example, wafer image and a wafer target are determined to converge based on the difference between the pixelated representation of the wafer image and the wafer target being less than a threshold. In another example, a wafer image and a wafer target are determined to converge based on the difference between intensities of the wafer image and wafer target being less than a threshold. In yet another example, a wafer image and a wafer target are determined to converge based on the width and/or spacing of the wafer image satisfying a corresponding threshold or thresholds.

At block 322, the dose information is modified. The mask synthesis engine 110 modifies the does information based on a determination that the wafer image the wafer target do not converge. The dose information is modified as described by blocks 230-238 of the method 200 of FIG. 2.

The mask synthesis engine 110 generates an updated wafer image based on the modified dose information at block 314. The updated wafer image is compared to the wafer target at block 318, and, at block 320, a determination as to whether or not the updated wafer image converges with the wafer target. The loop including blocks 322, 314, 318, and 320 is continued until the wafer image is determined to converge with the wafer target.

At block 324, the dose information is output based on a determination that the wafer image and the target image converge at block 320. The mask synthesis engine 110 outputs the dose information to the mask writing device 120. The mask synthesis engine 110 may store the dose information a memory of the lithography system 100. The memory is accessed by the mask writing device 120 to acquire the dose information.

FIG. 4 illustrates example dose information 410 and 420 for a polygon of a mask design. The dose information 410 is a two dimensional representation of the dose information. The gradient illustrates the corresponding dose amount (e.g., energy amount) for the polygon of the mask design. The dose information 420 is a three dimensional representation of the dose information. The different heights of the three dimensional representation corresponds to the location and dose amount (e.g., energy amount) for the polygon of the mask design.

Figure 5:
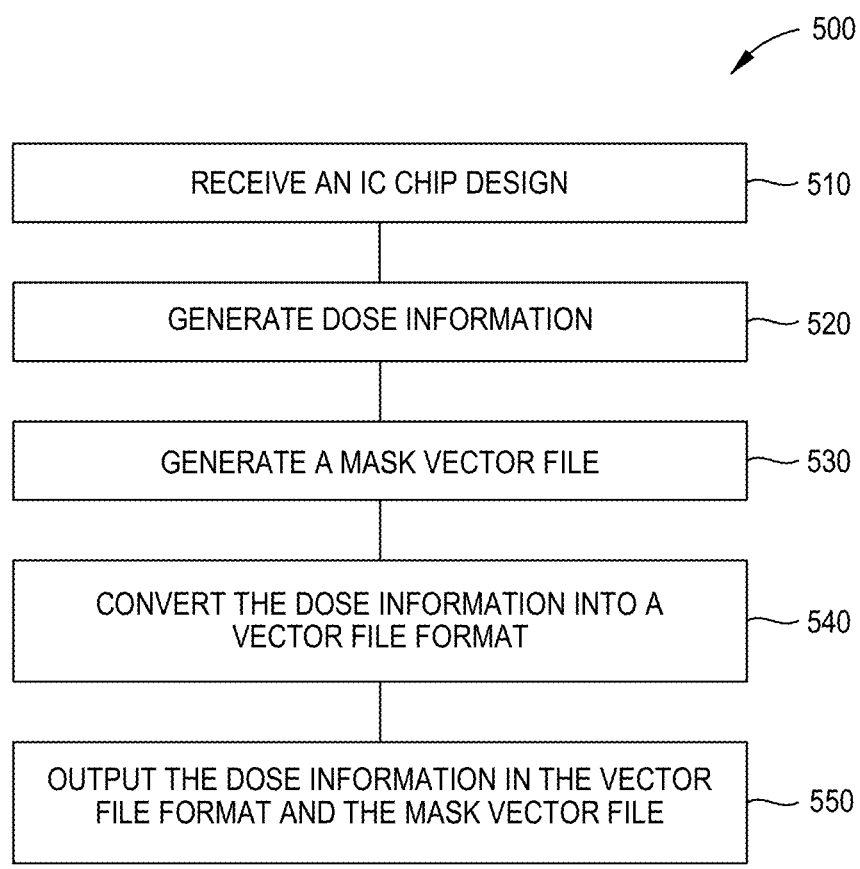
FIG. 5 illustrates a flowchart of a method for outputting a vector based file for dose information, in accordance with some embodiments of the present disclosure.

In one example, and as is described with regard to FIG. 5, a vector based file format is utilized to communicate the dose information from the mask synthesis engine 110 to the mask writing device 120. The dose information may be utilized to enhance the mask writing process by mask writer tools. Vector based file formats include OASIS or Graphic Design System (GDS) file formats, among others. Vector based file formats are binary file formats that represent planar geometric shapes, text labels, and other information about a layout in hierarchical formal. The data of a vector based file format can be used to create photomasks. Further, alternative file formats, e.g., a pixelated dose map, may be utilized to communicate the dose information from the mask synthesis engine 110 to the mask writing device 120.

The mask vector file includes planar geometric shapes, text labels, and other information about a layout in hierarchical formal that is utilized by a mask writing tool (e.g., the mask writing device 120) to generate a mask. The mask writing device 120 receives the dose information and the mask vector file and generates a mask to be used in the fabrication of an IC chip.

FIG. 5 illustrates a flow chart of a method 500 for communicating dose information from a mask synthesis engine to a mask writer device. The method 500 is executed by the mask synthesis engine 110. The method 500 is executed as part of mask data preparation 1132 of FIG. 11.

At block 510, an IC chip design is received. For example, the mask synthesis engine 110 receives the IC chip design from another processing system, an input device, or a memory device. The chip design may be in a vector format (e.g., OASIS or GDS file format) or another file format.

At block 520, dose information is generated. The mask synthesis engine 110 generates the dose information from the IC chip design. Generating the dose information comprises converting the IC chip design into a resterized (e.g., bitmap or other raster image file) representation. The representation of the dose information can be constructed by a rasterization method or other geometry based method which converts polygons to bitmap (or another image type) fields. In one example, the polygons of the IC chip design are converted to a levelset representation. In another example, a rule based assignment is applied to determine local doses for pixels proximate the edges of the polygons of the IC chip design. The rule based assignment may include geometry based metrics. In another example, applying the rule based assignment may include determining a Gaussian distribution of a dose centered at edges of the polygons of the IC chip design. Further methods may include using polygon density or curvature methods to determine dose amounts for the polygons of the IC chip design.

At block 530, a mask vector file is generated. The mask vector file is generated by the mask synthesis engine 110. The mask vector file includes planar geometric shapes, text labels, and other information about a layout of an IC chip in a hierarchical form that is utilized to generate a printed mask. The mask synthesis engine 110 generates the mask vector file from the IC chip design. The mask vector file includes the mask design generated from the IC chip design. The mask design of the mask vector file is used by the mask writing device 120 to generate a printed mask. The mask design of the mask vector file includes polygons that define the different elements of the IC chip design.

In one example, the blocks 520 and 530 occur during at least overlapping periods. In another example, the blocks 520 and 530 occur during non-overlapping periods.

At block 540, the dose information is converted to a vector file format. The mask synthesis engine 110 converts the dose information a vector file format. In one example, the dose information is represented as an image file. For example, the dose information is represented as a bitmap file or other rastered image file. The image file used to represent the dose information includes a mapping of a range of integers to bits. Converting the image file to a vector format file includes vectorizing the image file. Vectorizing the image file may include reconstructing of the image file to represent the image file with one or more mathematical formulas. For example, vectorizing the image file includes generating one or more lines, polygons, Bezier curves, and the like from the image file. In one or more examples, the above described mathematical constructs may be further applied to enhance two dimensional curve or polygon representations with three dimensional information. Example three dimensional information is further described in FIGS. 7 and 9. In such examples, data corresponding to the three dimensional information may be in the form of auxiliary tables or lists, among others, which correspond to the above described mathematical constructs.

At block 550, the dose information in the vector file format and the mask vector file are output. The mask synthesis engine 110 outputs the dose information in the vector file format and the mask vector file to the mask writing device 120. The dose information in the vector file format and the mask vector file may communicated from the mask synthesis engine 110 to the mask writing device 120 in parallel to each other or serially to each other. In another example, the dose information in the vector file format and the mask vector file are output to a memory of the lithography system 100, and the mask writing device 120 acquires the dose information in the vector file format and the mask vector file from the memory.

Figure 6:
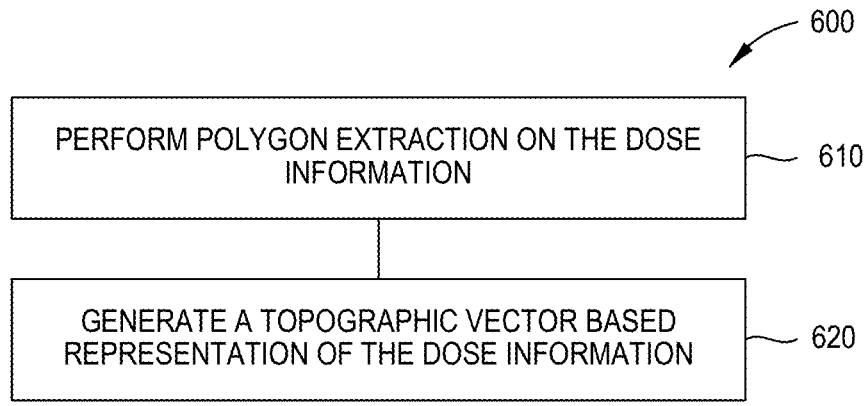
FIG. 6 illustrates a flowchart of a method for vectorizing dose information, in accordance with some embodiments of the present disclosure.

FIG. 6 illustrates a flow cart of a method 600 for converting the dose information to a vector file format, according to one or more examples. The method 600 is executed by the mask synthesis engine 110. The method 600 corresponds to block 540 of the FIG. 5. At block 610, polygon extraction is performed on the dose information. The mask synthesis engine 110 performs polygon extraction on the dose information. In one example, the dose information is represented by an image file. Performing polygon extraction comprises contouring the image file at multiple dose levels. In one example, 32 levels are used. In other examples, more than or less than 32 levels may be used. Contouring the image file includes detecting maximum and minimum dose values from the image file. Contour heights are selected such that the three dimensional behavior of the dose surface is approximated with a finite set of contoured heights. In one example, a set of values is selected from the maximum and minimum dose values to be used as the contour heights. The set of values may be equally spaced between the maximum and minimum dose values. In other examples, the set of values are not equally spaced between the maximum and minimum dose values. In one example, the values of the set of values are selected such that the values are clustered near the values where the pixels of the image file has the steepest slope (e.g., largest magnitude of variation).

At block 620, a topographical vector based representation of a dose information is generated from the contoured image file. The topographical vector based representation includes the contours (or other values) generated at block 610. Further, the topographical vector based representation is output as a vector file (e.g., an OASIS, GDS, or other vector file format). In one example, additional information is associated with each contour and may be used to interpret the meaning of each contour. For example, the additional information may be used to determine the associated dose level associated with each contour.

FIG. 7 illustrates an example polygon 700 of the dose information. The polygon 700 includes a dose profile 710. The dose profile 710 is localized near the edge of the polygon 700. The background includes binary dose values. The graph 720 illustrates a cutline of the dose profile 710. In the cutline, the different bar heights correspond to different concentric polygon layers in the dose profile 710. Each of the polygon layers of the dose profile 710 is associated with a different dose value (or dose level). In one example, the range of dose values corresponds to the minimum to the maximum value that the corresponding mask writer can produce.

Figure 8:
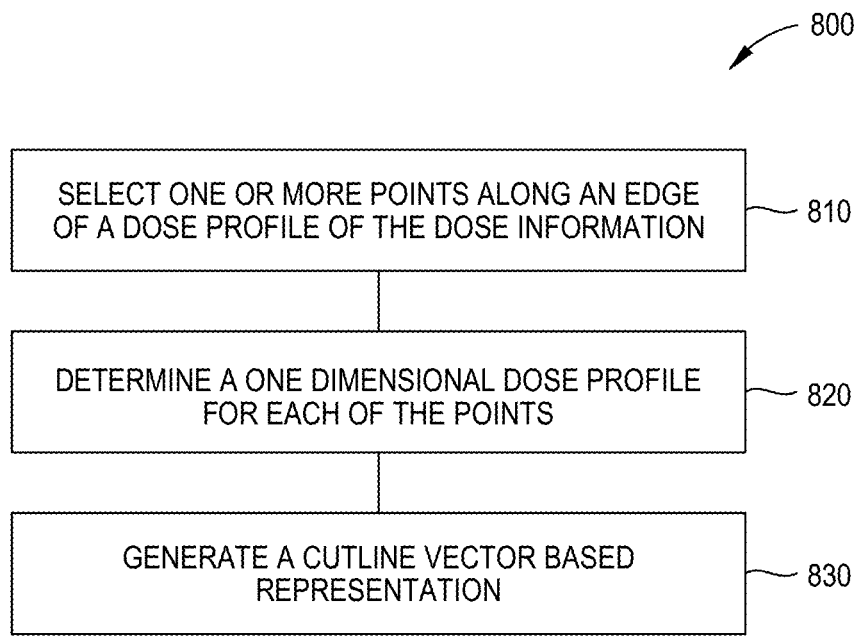
FIG. 8 illustrates a flowchart of a method for vectorizing dose information, in accordance with some embodiments of the present disclosure.

FIG. 8 illustrates a flow cart of a method 800, for converting the dose information to a vector file format, according to one or more examples. The method 800 is executed by the mask synthesis engine 110. The method 800 corresponds to block 540 of the method 500 of FIG. 5. At block 810, one or more points along an edge of a dose profile of the dose information are selected. For example, the mask synthesis engine 110 processes the image file of the dose information to select one or more points along one or more edges of a dose profile. In one example, one or more points are selected along an edge of a dose profile by selecting locations where the local pixel variation, or slope, is the largest. The one or more points may be selected before or after the dose profile is generated. In one example, the locations of a dose profile having the largest local pixel variation along the edge of the profile are identified, and the locations are used as the selected points. The largest local variation may be determined by searching in a region near a given point and finding the range of dose values in the search region. The size of the search region may be user defined and/or determined from heuristics. In one example, the local maximum and minimum values are determined along a ray perpendicular to the polygon edge from a given point. The pixel variations of multiple dose profile locations are compared to a threshold value, and the dose profiles associated with pixel variations that exceed the threshold value are selected. In one example, the pixel variations of the dose profile selections are determined by computing the dose map spatial gradient or slope and finding local maxima or minima. The local maxima and minima are determined based on directions perpendicular to the edges of the profile. Alternatively, or additionally, binary mask polygon edges are used as a guide to determine the profile locations along the edge. In one example, the binary mask polygon edges are generated based on a simulated prediction of the written mask edge locations, and the dose information is used to select the one or more points along the polygon edges. The local MEEF of the polygon edges may be used to determine which of the polygon edges are most critical when selecting the one or more points.

At block 820, a one dimensional dose profile for each selected point is determined. The mask synthesis engine 110 generates the one dimensional dose profile for each selected point. In one example, for each selected point along the dose profile, a search is performed to determine a one dimensional dose profile. This search captures the local dose variation in a direction perpendicular to the polygon edge and values which can be quantized to the dose levels different from the binary foreground and background magnitudes. The binary foreground and background magnitudes are selected as doses to be applied inside the most interior contour and outside the most exterior contour, respectively.

At 830, a cutline vector based representation is generated. The mask synthesis engine 110 generates the cutline vector based representation. The cutline representation at a given point includes the distance in the signed perpendicular direction away from the edge of a corresponding mask, and a corresponding dose value for that distance. In one example, the gradient of the image file is used to determine a normal direction of the image file surface. A gauge length for a local variation along the normal direction away from the selected point is determined. The gradient and gauge length represent the direction and length of the cutline vector. In one example, sampling is performed along the gauge length (e.g., line segment) at equally spaced steps. In another example, the image file is approximated with Gaussian functions to construct a table of values to be stored for a selected point. In one example, the dose value (or level) is parametrized with a basis function and stored in a tabular format. For example, the gauge endpoint coordinates (e.g., two ends of the line segment of the gauge) are used to parametrize the dose levels with a basis function. In another example, histogram bins are associated with the dose levels. An entry for each dose level is made in the histogram bins. In one example, a Gaussian functional representation, or other shaped functional representation, is generated for the local dose variation along a gauge of finite length. The Gaussian functional representation, or other shaped functional representation, is generated by sampling the dose profile along the gauge and fitting a Gaussian function, or other mathematical function, to the profile using a mathematical model fitting regression technique. In another example, a two dimensional representation may be stored local to the selected points as a local pixelated representation of the dose or a parameterized functional representation. For example, a superposition of two dimensional Gaussian function, or other basis function, may be utilized.

FIG. 9 illustrates a dose profile 900 with points 902 around the edge of the dose profile 900. The points 902 corresponds to perpendicular gauges around the mask polygon. The gauge of each point 902 can be used for the portion of the polygon proximate each of the points 902. The point 902a corresponds to graph 910 and the point 902b corresponds to the graph 920. The graphs 910 and 920 illustrate a cutline of the dose profile 900 at the points 902a and 902b, respectively. In the graphs 910 and 920, the different bar heights correspond to different dose values (e.g., levels).

As compared to the method 600 of FIG. 6, the method 800 of FIG. 8 can generate a dose map that is smaller in data size. For example, the dose profile 900 includes a smaller number of polygon vertices as that of the dose profile 710 of FIG. 7. Further, the concentric polygons illustrated in FIG. 7 contain redundant information when the distance between the polygons does not varying for long lengths along a polygon edge. In one example, if the concentric polygons in FIG. 7 are equally spaced, a dose profile as described with regard to FIG. 9 is be able to represent the same information with one polygon and a single gauge length. Accordingly, the total data size for dose profile 900 is smaller than that of FIG. 7 and is able communicate the same information.

Figure 10:
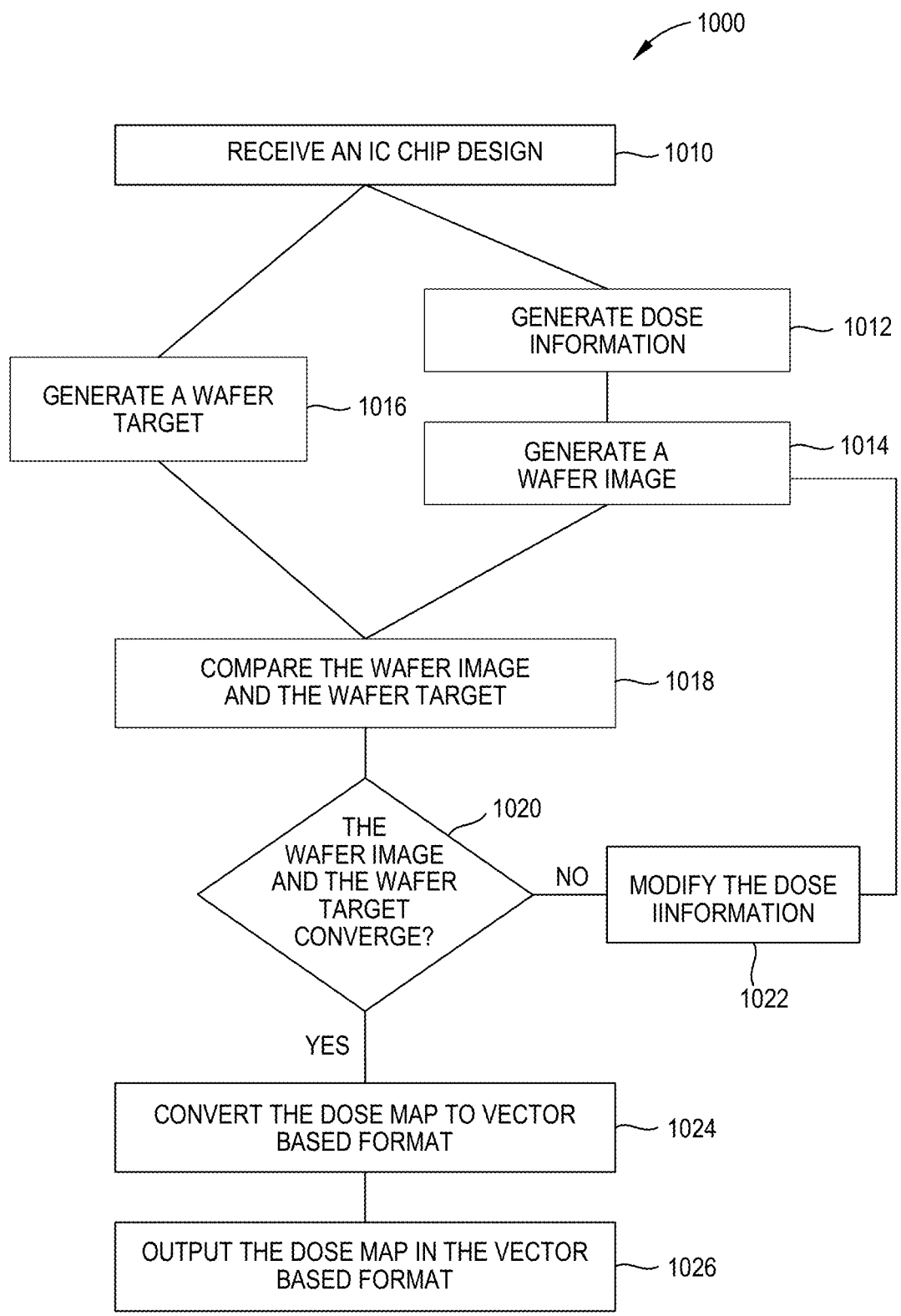
FIG. 10 illustrates a flowchart of a method for outputting a vector based file for dose information, in accordance with some embodiments of the present disclosure.

FIG. 10 illustrates a flow chart of a method 1000 for output dose information in a vector file format, according to one or more examples. The method 1000 is executed by the mask synthesis engine 110 of FIG. 1. Further, the method 1000 is executed as part of mask data preparation 1132 of FIG. 11.

At block 1010, an IC chip design is received. At blocks 1012 and 1014, a dose map and wafer image are generated, and at block 1016, a wafer target is generated. At block 1018, the wafer image and the wafer target are compared, and a determination as to whether the wafer image and the wafer target converge is made at block 1020. Based on a determination that the wafer image and the wafer target do not converge, the dose map is modified at block 1022 and an updated wafer image is generated at block 1014 from the modified dose map. The blocks 1010, 1012, 1014, 1016, 1018, 1020, and 1022 are similar to the blocks 310, 312, 314, 316, 318, 320, and 322 of the method 300 of FIG. 3.

At block 1024, the does information is converted to a vector based format. The block 1024 is similar to block 540 of the method 500 of FIG. 5. At block 1026, the dose information in the vector file format and the mask vector file are output. The block 1026 is similar to the block 550 of the method 500 of FIG. 5.

FIG. 11 illustrates an example set of processes 1100 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1110 with information supplied by a designer, information which is transformed to create an article of manufacture that uses a set of EDA processes 1112. When the design is finalized, the design is taped-out 1134, which is when artwork (e.g., geometric patterns) for the integrated circuit is sent to a fabrication facility to manufacture the mask set, which is then used to manufacture the integrated circuit. After tape-out, a semiconductor die is fabricated 1136 and packaging and assembly processes 1138 are performed to produce the finished integrated circuit 1140.

Specifications for a circuit or electronic structure may range from low-level transistor material layouts to high-level description languages. A high-level of abstraction may be used to design circuits and systems, using a hardware description language ('EIDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 11. The processes described by be enabled by EDA products (or tools).

During system design 1114, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1116, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1118, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1120, the netlist is checked for compliance with timing constraints and for correspondence with the HDL code. During design planning 1122, an overall floor plan for the integrated circuit is constructed and analyzed for timing and top-level routing.

During layout or physical implementation 1124, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1126, the circuit function is verified at the layout level, which permits refinement of the layout design. During physical verification 1128, the layout design is checked to ensure that manufacturing constraints are correct, such as DRC constraints, electrical constraints, lithographic constraints, and that circuitry function matches the HDL design specification. During resolution enhancement 1130, the geometry of the layout is transformed to improve how the circuit design is manufactured.

During tape-out, data is created to be used (after lithographic enhancements are applied if appropriate) for production of lithography masks. During mask data preparation 1132, the 'tape-out' data is used to produce lithography masks that are used to produce finished integrated circuits.

A storage subsystem of a computer system (such as computer system 1200 of FIG. 12) may be used to store the programs and data structures that are used by some or all of the EDA products described herein, and products used for development of cells for the library and for physical and logical design that use the library.

FIG. 12 illustrates an example machine of a computer system 1200 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM), a static memory 1206 (e.g., flash memory, static random access memory (SRAM), etc.), and a data storage device 1218, which communicate with each other via a bus 1230.

Processing device 1202 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 may also be one or more special-purpose processing devices such as an application specific integrated circuit (ASIC), a field programmable gate array (FPGA), a digital signal processor (DSP), network processor, or the like. The processing device 1202 may be configured to execute instructions 1226 for performing the operations and steps described herein.

The computer system 1200 may further include a network interface device 1208 to communicate over the network 1220. The computer system 1200 also may include a video display unit 1210 (e.g., a liquid crystal display (LCD) or a cathode ray tube (CRT)), an alphanumeric input device 1212 (e.g., a keyboard), a cursor control device 1214 (e.g., a mouse), a graphics processing unit 1222, a signal generation device 1216 (e.g., a speaker), graphics processing unit 1222, video processing unit 1228, and audio processing unit 1232.

The data storage device 1218 may include a machine-readable storage medium 1224 (also known as a non-transitory computer-readable medium) on which is stored one or more sets of instructions 1226 or software embodying any one or more of the methodologies or functions described herein. The instructions 1226 may also reside, completely or at least partially, within the main memory 1204 and/or within the processing device 1202 during execution thereof by the computer system 1200, the main memory 1204 and the processing device 1202 also constituting machine-readable storage media.

In some implementations, the instructions 1226 include instructions to implement functionality corresponding to the present disclosure. While the machine-readable storage medium 1224 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1202 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
   receiving an integrated circuit (IC) design file;
   determining, by one or more processors, dose information from the IC design file;
   determining, by the one or more processors, a mask vector file from the IC design file;
   converting, by the one or more processors, the dose information to a vector file format by:
      contouring an image file representing the dose information at one or more dose levels to extract one or more polygons; and
   outputting the dose information in the vector file format and the mask vector file to a mask writer device.

2. The method of claim 1, wherein converting the dose information to the vector file format comprises:
   generating a topographic vector based representation of the dose information based on the contoured image file.

3. The method of claim 2, wherein contouring the image file representing the dose information at the one or more dose levels to extract the one or more polygons comprises:
   contouring the image file at the one or more dose levels to detect maximum and minimum dose values within the dose information.

4. The method of claim 2, wherein a dose profile is localized near an edge of the one or more polygons.

5. The method of claim 1, wherein converting the dose information to the vector file format comprises:
   selecting one or more points along a dose profile of the dose information; and
   determining a profile for each of the one or more points.

6. The method of claim 5, wherein selecting the one or more points along the dose profile comprises selecting the one or more points based on a local pixel variation.

7. The method of claim 5, further comprising determining a cutline vector based representation based on the profile for each of the one or more points, wherein the cutline vector based representation indicates a dose level of the one or more dose levels for each of the one or more points.

8. A lithographic system comprising:
   a memory; and
   a processor coupled with the memory, the processor configured to:
      receive an integrated circuit (IC) design file;
      determine dose information from the IC design file;
      determine a mask vector file from the IC design file;
      convert the dose information to a vector file format by:
         determining a profile of one or more points along a dose profile of the dose information; and
      output the dose information in the vector file format and the mask vector file to a mask writer device.

9. The lithographic system of claim 8, wherein converting the dose information to the vector file format comprises:
   extracting one or more polygons from the dose information; and
   generating a topographic vector based representation of the dose information based on the extracted one or more polygons.

10. The lithographic system of claim 9, wherein the dose information is represented by an image file, and wherein extracting the one or more polygons comprises:
    contouring the image file at dose levels to detect maximum and minimum dose values within the dose information, wherein the topographic vector based representation is generated from the contoured image file.

11. The lithographic system of claim 9, wherein the dose profile is localized near an edge of the one or more polygons.

12. The lithographic system of claim 8, wherein converting the dose information to the vector file format comprises:
    selecting the one or more points along the dose profile of the dose information, and
    wherein determining the profile of the one or more points along the dose profile of the dose information comprises determining a profile for each of the one or more points.

13. The lithographic system of claim 12, wherein selecting the one or more points along the dose profile comprises selecting the one or more points based on a local pixel variation.

14. The lithographic system of claim 12, further comprising determining a cutline vector based representation based on the one dimensional profile for each of the one or more points, wherein the cutline vector based representation indicates a dose level for each of the one or more points.

15. A non-transitory computer readable medium comprising stored instructions, which when executed by a processor, cause the processor to:
    receive an integrated circuit (IC) design file;
    determine dose information from the IC design file;
    determine a mask vector file from the IC design file;
    convert the dose information to a vector file format by at least one or more of:
       contouring an image file representing the dose information at one or more dose levels to extract one or more polygons; and
       determining a profile of one or more points along a dose profile of the dose information; and
    output the dose information in the vector file format and the mask vector file to a mask writer device.

16. The non-transitory computer readable medium of claim 15, wherein converting the dose information to the vector file format comprises:
    generating a topographic vector based representation of the dose information based on the contoured image file.

17. The non-transitory computer readable medium of claim 16, wherein contouring the image file representing the dose information at the one or more dose levels to extract the one or more polygons comprises:
 contouring the image file at the one or more dose levels to detect maximum and minimum dose values within the dose information.

18. The non-transitory computer readable medium of claim 15, wherein converting the dose information to the vector file format comprises:
 selecting the one or more points along the dose profile of the dose information, and
 wherein determining the profile of the one or more points along the dose profile of the dose information comprises determining a profile for each of the one or more points.

19. The non-transitory computer readable medium of claim 18, wherein selecting the one or more points along the dose profile comprises selecting the one or more points based on a local pixel variation.

20. The non-transitory computer readable medium of claim 18, further comprising determining a cutline vector based representation based on the profile for each of the one or more points, wherein the cutline vector based representation indicates a dose level of the one or more dose levels for each of the one or more points.

* * * * *